United States Patent [19]

Amoroso et al.

[11] Patent Number: 4,644,299

[45] Date of Patent: Feb. 17, 1987

[54] MULTIMODE NOISE GENERATOR USING DIGITAL FM

[75] Inventors: Frank Amoroso, Santa Ana; John S. Cullings, Laguna Beach, both of Calif.

[73] Assignee: Hughes Aircraft Company, Los Angeles, Calif.

[21] Appl. No.: 830,309

[22] Filed: Feb. 14, 1986

[51] Int. Cl.⁴ .............................................. H03B 29/00
[52] U.S. Cl. .......................................... 331/78; 455/1
[58] Field of Search .......................... 331/78; 364/717; 328/59; 455/1; 343/18 E

[56] References Cited

U.S. PATENT DOCUMENTS 4,342,119  7/1982  Seidl .................................... 331/78 X
4,396,894  8/1983  Willmore ............................... 331/78
4,507,796  3/1985  Stumfall ............................... 331/78 X Primary Examiner—Siegfried H. Grimm
Attorney, Agent, or Firm—T. A. Runk; A. W. Karambelas

[57] ABSTRACT

A pseudorandom noise generator which operates in different modes is disclosed. The pseudorandom noise generator (10) includes circuitry (11,13) for providing a digital signal having a pseudorandom sequence at a selected clock rate; a modulation control circuit (15, 17, 20, 23) for selectively providing a modulation control signal that corresponds to either a non-filtered or filtered version of the digital signal, and for controlling the mode of operation of the noise generator; a modulation circuit (27, 29, 31, 33) responsive to the modulation control signal for providing a modulation signal; and a voltage controlled oscillator (VCO) (35) responsive to the modulation signal for providing a VCO output having a relatively constant output spectrum and high spectral containment for each mode of operation pursuant to control by the modulation control circuit and the modulation circuit.

20 Claims, 3 Drawing Figures

MULTIMODE NOISE GENERATOR USING DIGITAL FM

BACKGROUND OF THE INVENTION

The disclosed invention is directed to noise generating circuitry, and is more particularly directed to a pseudorandom noise generator which produces pseudorandom noise by digital frequency modulation and is switchable for operation in different modes.

Pseudorandom noise generators are utilized in various applications such as system testing, secure communications, and electronic signal jamming. Depending on the application, certain characteristics of the output noise signal may be desirable. For example, a relatively narrow band output having a flat in-band spectrum and a high degree of spectral containment may be advantageous for jamming an individual victim receiver having a center frequency and bandwidth that are known approximately. As another example, a relatively wide band output having a flat in-band spectrum and a high degree of spectral containment may be advantageous for jamming a class of victim receivers which are known to be operating within a relatively wide bandwidth. In both examples, the high degree of spectral containment avoids jamming signals in other frequency ranges where jamming is not desired.

Disadvantages of known pseudorandom noise generators include the limitation of operating in only one mode. For example, a noise generator that provides a flat output for a low FM modulation index would generally be incapable of providing a flat output for a high FM modulation index. Another disadvantage of known pseudorandom noise generators is the use of complex analog circuitry which is subject to drift due to aging as well as changes in environmental conditions.

SUMMARY OF THE INVENTION

It would therefore be an advantage to provide a pseudorandom noise generator which is readily and easily controlled to operate in different modes.

It would also be an advantage to provide a pseudorandom noise generator which operates in different modes and which efficiently provides for a noise output having reasonably flat in-band amplitude and a high degree of spectral containment for each mode of operation.

Another advantage would be to provide a pseudorandom noise generator which maintains a high degree of spectral containment in operation with either a low index of modulation or a high index of modulation.

Still another advantage would be to provide a pseudorandom noise generator which utilizes digital frequency modulation and substantially reduces drift.

The foregoing and other advantages and features are provided in a pseudorandom noise generator which includes circuitry for providing a digital signal having a pseudorandom sequence at a selected clock rate; a modulation control circuit for selectively providing a modulation control signal that corresponds to either a non-filtered or filtered version of the digital signal, and for controlling the mode of operation of the noise generator; a modulation circuit responsive to the modulation control signal for providing a modulation signal; and a voltage controlled oscillator (VCO) responsive to the modulation signal for providing a VCO output having a relatively constant output spectrum and high spectral containment for each mode of operation pursuant to control by the modulation control circuit and the modulation circuit.

More particularly, in the disclosed embodiment, the modulation control circuit provides for two modes of operation including (a) a first mode of operation wherein a low index of modulation is utilized and the digital signal is directly provided to the modulation circuit, and (b) a second mode of operation wherein a high index of modulation is utilized and the filtered version of the digital signal is provided to the modulation circuit. The filtered version of the digital signal is provided by a low pass filter that has a time constant adjusted to a selected clock rate to achieve a relatively constant probability density function for the output of the low pass filter.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION OF THE DISCLOSURE

Figure 1:
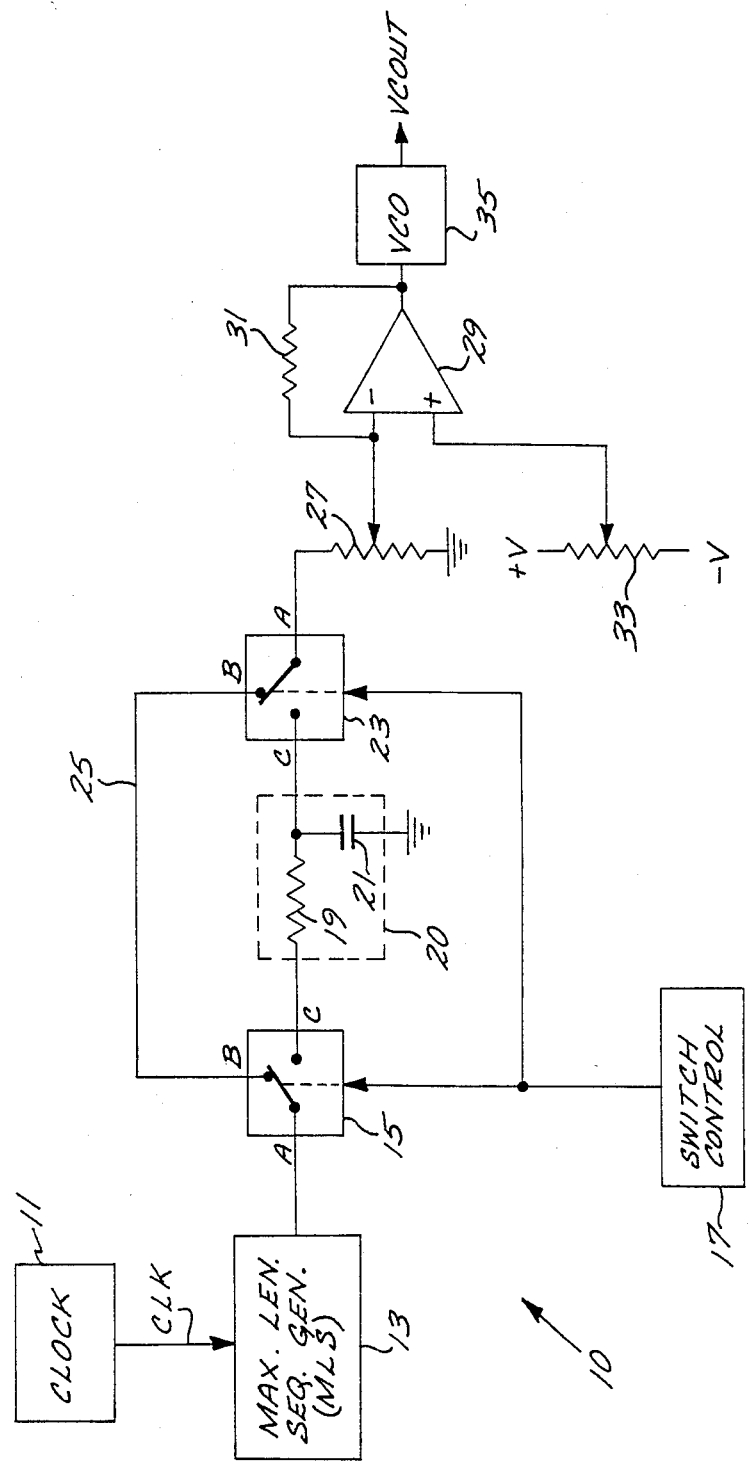
FIG. 1 is a schematic diagram of the disclosed pseudorandom noise generator.

In the following detailed description and in the several figures of the drawing, like elements are identified with like reference numerals.

Referring now to FIG. 1, shown therein is a pseudorandom noise generator 10 which includes a clock signal generator 11 for generating a clock signal CLK having a selectable frequency. The clock signal CLK is provided to a maximum length sequence (MLS) generator 13 which provides as its output a digital signal that includes a pseudorandom sequence of bits. Maximum length sequence generators are well known in the art and generally include cascaded shift register stages with appropriate feedback circuitry. Maximum length sequence generators provide digital output sequences that have patterns that repeat only after a very large number of output bits. For example, an MLS generator having 23 shift register stages may be configured to provide an output sequence which repeats only after 8,388,607 output bits and is therefore referred to as having a code length of 8,388,607.

By way of the example, the output of the maximum length sequence generator is a series of pulses having a voltage level of V1 or V2, where V1 is greater than V2.

The output of the maximum length sequence generator 13 is coupled to the switched terminal A of a switch 15 which further includes terminals B and C. The switched terminal A is selectively coupled to either the terminal B or the terminal C pursuant to a switch control circuit 17. The terminal C of the switch 15 is coupled to a low pass filter 20 which includes a resistor 19 and a capacitor 21. One terminal of the resistor 19 is coupled to the terminal C of the switch 15, while its other terminal is coupled to one terminal of the capacitor 21. The other terminal of the capacitor 21 is coupled to a ground reference level.

The common node between the resistor 19 and the capacitor 21 is further coupled to a terminal C of a switch 23, which further includes another terminal B and a switched terminal A. The switch 23 is controlled in parallel with the switch 15 by the switch control circuit 17. Thus, at any given time, the respective switched terminals A are coupled to either respective terminals B or respective terminals C.

A bypass connector 25 is coupled between the respective B terminals of the switches 15, 23. Thus, when the switches 15, 23 are controlled to couple their respective A terminals to respective B terminals, the low pas filter 20 is bypassed.

The A terminal of the switch 23 is coupled to a terminal of a potentiometer 27 which has its other terminal coupled to ground. The wiper contact of the potentiometer 27 is coupled to the inverting input of an operational amplifier 29 which preferably is a high speed device. A feedback resistor 31 is coupled between the output of the operational amplifier 29 and its inverting input.

The non-inverting input of the operational amplifier 29 is coupled to the wiper contact of a potentiometer 33. The fixed terminals of the potentiometer 33 are respectively coupled to positive and negative reference voltages V+ and V−.

The output fo the operational amplifier 29 is provided as the control signal to a voltage controlled oscillator 30 (VCO) 35.

A VCO is a well-known oscillator circuit which provides an output signal having a frequency controlled by the voltage of the input control signal. Thus, the output of the operational amplifier 29 modulates the VCO 35. The output signal VCOUT provided by the VCO 35 is the output of the pseudorandom noise generator 10.

Referring particularly to the inputs to the operational amplifier 29, the potentiometer 27 controls the gain of the operational amplifier 29. Accordingly, the potentiometer 27 controls the voltage swing of the output of the operational amplifier. As discussed more fully herein, the potentiometer 27 and the voltage swing of the operational amplifier 29 to some degree control the bandwidth of the output signal VCOUT provided by the VCO 35. As used herein and unless otherwise specified, the term "bandwidth" shall generally refer to the range of frequencies which are within 3 dB of the maximum and may also be called the "3 dB bandwidth".

The potentiometer 33 provides a selectable offset voltage for the operational amplifier 29. The offset voltage selected controls the center frequency of the VCO output VCOUT.

In this embodiment, the pseudorandom noise generator 10 operates in one of two modes as determined by the state of the switches 15, 23 as controlled by the switch control circuit 17. The mode of operation when the switched terminal A is coupled to the terminal B shall be referred to as the direct digital or bypass mode. The mode of operation when the switched terminal A is coupled to the terminal B shall be called the low pass mode.

In the bypass or direct digital mode, the output signal VCOUT of the VCO 35 has a low modulation index (less than 1.0), and has a bandwidth that is numerically comparable to the rate of the clock signal CLK. The modulation index D is controlled by varying the setting of the potentiometer 27 to obtain an output signal VCOUT having a spectrum that is "maximally flat" within the bandwidth of the output signal. Increasing the attenuation of the digital signal provided to the operational amplifier reduces the modulation index, but also decreases the center frequency of the output VCOUT. Thus, once a maximally flat output signal VCOUT is provided, the potentiometer 33 may be adjusted to achieve the desired center frequency.

It should be noted that for a modulation index less than that for a maximally flat output signal VCOUT, the spectrum of the resulting signal VCOUT will be more rounded. For a modulation index greater than that for a maximally flat output signal VCOUT, the spectrum of the resulting signal VCOUT will have peaks near the edges of the bandwidth. The effects of the modulation index on a frequency modulated signal resulting from modulation with a random binary waveform is discussed in "The Autocorrelation Function and Power Spectrum of PCM/FM with Random Binary Modulating Waveforms," Pelchat, IEEE Transactions on Space Electronics and Telemetry, Vol. SET-10, No. 1, 1964, pp. 39–44.

The foregoing reference to modulation index is well known in the art of digital data FM modulation. Particularly, the modulation index D is defined as follows:

$$D = \frac{f_1 - f_2}{R} \qquad \text{(Equation 1)}$$

In Equation 1, $f_1$ is the frequency that would be generated by the VCO 35 in response to a steady state voltage corresponding to the lowest voltage applied to the inverting input of the operational amplifier 29; and $f_2$ is the frequency that would be generated by the VCO in response to a steady state voltage corresponding to the highest voltage applied to the inverting input of the operational amplifier 29. The symbol R denotes the bit rate of the modulating digital signal, and in this case is the bit rate of the output of the maximum length sequence generator 13.

With the modulation index set to provide an output signal VCOUT having a maximally flat spectrum, the output signal VCOUT is a noise-like signal having a relatively constant amplitude over the bandwidth of interest. That is, the signal VCOUT has a constant carrier signal envelope for different frequencies within the bandwidth.

Figure 2:
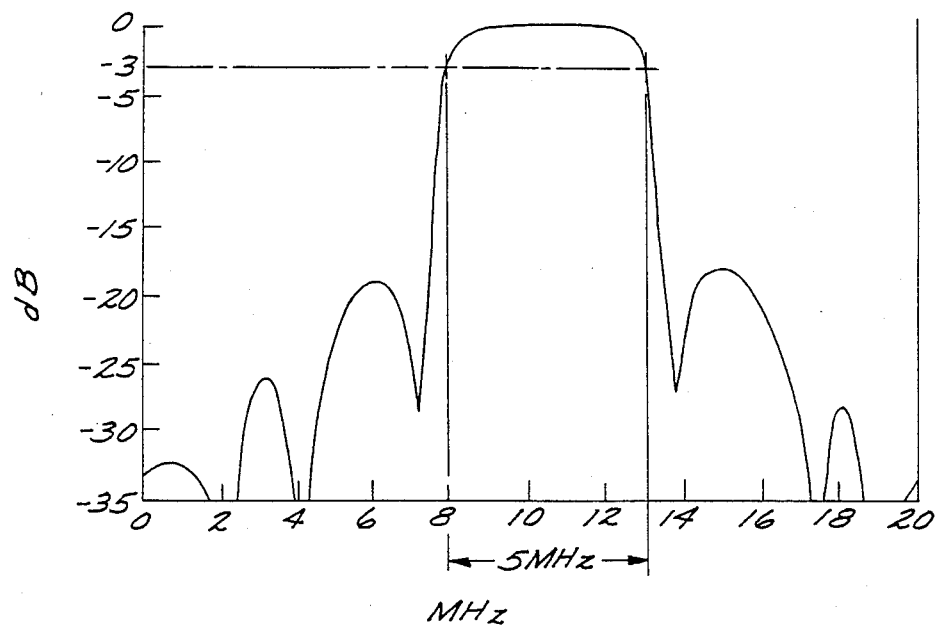
FIG. 2 is a schematic illustration of the spectrum of the output of the pseudorandom noise generator of FIG. 1 for operation in one of two possible modes of operation.

By way of example, FIG. 2 schematically illustrates the general form of a spectral plot for the VCOUT signal provided in the bypass mode with a modulation index of 0.672, which has been determined to provide an output signal VCOUT having a maximally flat spectrum. The clock rate utilized was 5 MHz, and the resulting 3 dB bandwidth was 5 MHz.

It should be noted that the theoretical modulation index for the bypass mode has been determined to be 0.634 for an output signal VCOUT having a maximally flat spectrum. The actual use relative to the spectral plot of the FIG. 2 of the slightly higher modulation index is believed to be the result of the non-ideal rise and fall times of the digital signal provided by actual implementation of the maximum length sequence generator 13.

With a maximally flat output spectrum, the 3 dB bandwidth of the output signal VCOUT is numerically very close to the rate of the clock signal CLK.

As to spectral containment, better than 90 percent of the energy is within the 3 dB bandwidth; and about 99 percent of the energy is within the main lobe.

The bypass mode (direct digital mode) of the pseudorandom noise generator 10 may be advantageously utilized in a jamming device. The output signal VCOUT provided by the VCO 35 would typically be provided to an output amplifier stage of the jamming device. For maximum prime power efficiency, the output amplifier stage should be maintained in saturation. Saturation of the output amplifier stage of a jamming device is more readily accomplished with a VCO output signal having a constant carrier envelope.

Further, operation of the pseudorandom noise generator 10 in the bypass mode is particularly advantageous for jamming a victim receiver with a hard limiter since the jam-to-signal ratio increases by about 6 dB as a result of the constant carrier signal envelope.

In the low pass mode, the output signal VCOUT provided by the VCO 35 has a high modulation index and a bandwidth that is numerically much greater than the rate of the clock signal CLK. The time constant of the low pass filter 20 is matched to the clock rate such that the probability density function of the output of the low pass filter 20 is constant; that is, any voltage level between and including V1 and V2 (the levels of the digital signal provided by the MLS 13) has the same probability of occurrence. Particularly, the RC time constant of the low pass filter 20 is inversely proportional to the clock rate of the clock signal CLK, and the proportionally constant may be determined empirically.

By way of example, it has been determined that an appropriate RC time constant should be about 1.44 times the time interval for one bit. Thus, such time constant may be expressed in seconds as 1.44/R, where R is the rate of the clock signal CLK.

It should be noted for a time constant shorter than an appropriate time constant, the probability density function of the output of the low pass filter 20 will have peaks on either side of the voltage centered between the reference voltages V1 and V2. For time constant longer than an appropriate time constant, the probability density function of the output of the low pass filter 20 will be bell shaped with a peak in the proximity of the voltage centered between the reference voltages V1 and V2.

As a result of such constant probability density function, the VCO output is relatively flat over the bandwidth of interest and has a constant carrier envelope.

In operation in the low pass mode, the clock rate is chosen as a function of the intermediate frequency (IF) bandwidth of the intended victim receivers. For example, it may be desired that the amount of time ("visitation time") that the VCO output corresponds to frequencies within such victim receiver bandwidth is the inverse of such IF bandwidth. However, the time interval during which the VCO output corresponds to a fixed frequency interval depends on the location of such fixed freqency interval within the VCO output bandwidth. By way of example, the VCO output may have a 3 dB bandwidth of 250 MHz, and the bandwidth of the victim receivers may be 5 MHz. For a 5 MHz frequency interval near the center of the bandwidth, the amount of time the VCO output corresponds to such frequency interval will statistically be less than the amount of time the VCO output corresponds to such a frequency interval near the ends of the bandwidth. By way of example, it has been determined that for frequencies of interest near the edges of the bandwidth, the above "visitation time" may be approximately achieved by choosing a clock rate that is the inverse of such "visitation" time, which provides a clock rate that is numerically equal to the victim receiver bandwidth.

In the low pass mode, the selected 3 dB bandwidth is controlled by the potentiometer 27. Particularly, in contrast to the direct digital or bypass mode, the 3 dB frequencies correspond to the lowest and highest voltages provided at the inverting input of the operational amplifier 29. Thus, the lower 3 dB frequency, denoted $f_1$ for reference, is the frequency that would be generated by the VCO 35 in response to a steady state voltage corresponding to the lowest voltage applied to the inverting input of the operational amplifier 29; and the higher 3 dB frequency, denoted $f_2$ for reference, is the frequency that would be generated by the VCO in response to a steady state voltage corresponding to the highest voltage applied to the inverting input of the operational amplifier 29. The 3 dB bandwidth would therefore be $(f_2-f_1)$.

Having chosen the appropriate clock rate and bandwidth, the appropriate center frequency is controlled by adjustment of the potentiometer 33.

Figure 3:
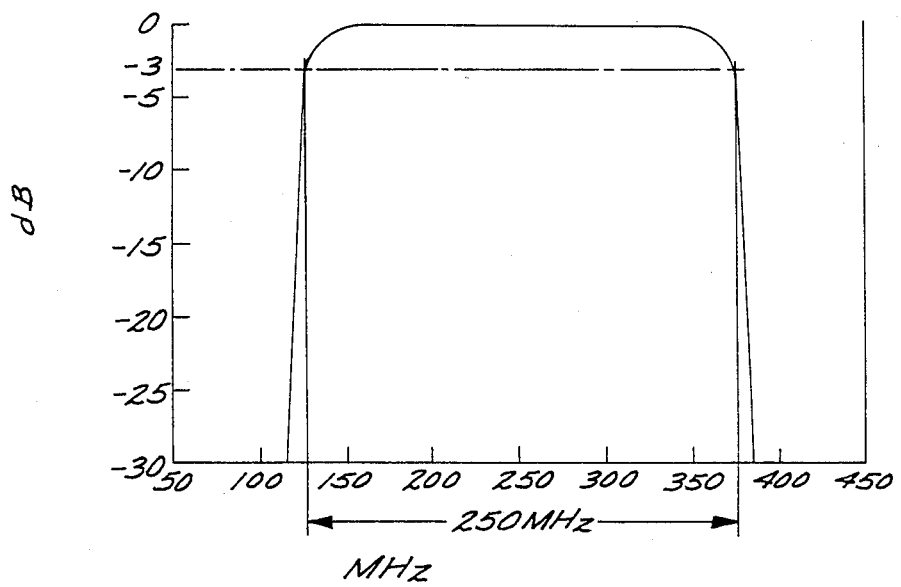
FIG. 3 is a schematic illustration of the spectrum of the output of the pseudorandom noise generator of FIG. 1 for operation in the other of two possible modes of operation.

Referring now to FIG. 3, schematically illustrated therein is the general form of a spectral plot for the VCOUT signal as generated in the low pass mode. By way of example, the spectral plot of FIG. 3 schematically illustrates the spectrum of the VCOUT signal for a clock frequency of 11.38 MHz, a time constant of 270 nanoseconds, and a 3 dB bandwidth of 250 MHz.

The low pass mode of operation provides for very high spectral containment. For example, for the prior example of a clock frequency of 11.38 MHz, a time constant of 270 nanoseconds and a 3 dB bandwidth of 250 MHz, the output signal VCOUT would be about 40 dB below maximum within 1 MHz outside the 3 dB bandwidth.

The low pass mode of operation is advantageously utilized for providing a pseudorandom noise output having a very wide bandwidth resulting from a high modulation index and having a relatively constant amplitude over such bandwidth. As a particular example, the low pass mode of operation is advantageously utilized in jamming a potentially large number of relatively narrow band radar victims generally occupying a total frequency range that may be in the order of 250 MHz.

It should be readily understood that the foregoing pseudorandom noise generator advantageously provides for operation in either of two major modes. The switching from one mode to another is easily accomplished by a toggling switch circuit, changing clock frequency if necessary, and making any appropriate changes for desired bandwidth and center frequency. Moreover, the disclosed pseudorandom noise generator utilizes primarily digital circuitry and therefore drift problems are substantially reduced.

As indicated previously, the disclosed pseudorandom noise generator may be utilized in secure communications systems, jamming systems, and system testing applications.

Although the foregoing has been a description and illustration of specific embodiments of the invention, various modifications and changes thereto can be made by persons skilled in the art without departing from the scope and spirit of the invention as defined by the following claims.

What is claimed is:

1. A noise generator comprising:
   means for providing a digital signal having a pseudo-random sequence at a selected clock rate;
   modulation control means for selectively providing a modulation control signal that corresponds to either a non-filtered or filtered version of said digital signal, said modulation control means controlling the mode of operation of the noise generator;
   modulation means responsive to said modulation control signal for providing a modulation signal; and
   a voltage controlled oscillator (VCO) responsive to said modulation signal for providing a VCO output having a relatively constant output spectrum and high spectral containment for each mode of operation pursuant to control by said modulation control means and said modulation means.

2. The noise generator of claim 1 wherein said modulation control means includes a low pass filter responsive to said digital signal for providing said filtered version of said digital signal to said modulation means.

3. The noise generator of claim 2 wherein said low pass filter has a time constant which is selected to provide a relatively constant probability density function for said filtered version of said digital signal over its voltage range.

4. The noise generator of claim 3 wherein said modulation control means includes switching circuitry for bypassing said low pass filter to directly provide said digital signal to said modulation means.

5. The noise generator of claim 4 wherein said modulation control means provides for two modes of operation including (a) a first mode of operation wherein a low index of modulation is utilized and said digital signal is provided to said modulation means, and (b) a second mode of operation wherein a high index of modulation is utilized and said filtered version of said digital signal is provided to said modulation means.

6. The noise generator of claim 5 wherein said modulation means comprises:
   means for controlling the level of said modulation control signal;
   an operational amplifier responsive to said modulation control signal for providing said modulation signal which has a swing determined by the level of said modulation control signal; and
   means for controlling the offset of said operational amplifier which determines the center frequency of the output of said VCO.

7. The noise generator of claim 6 wherein said level control means controls the modulation index for said first mode of operation and controls the bandwidth of said VCO output for said second mode of operation.

8. The noise generator of claim 7 wherein said level controlling means is adjusted in said first mode of operation to control said VCO output to have a maximally flat spectrum.

9. The noise generator of claim 6 wherein said level controlling means includes a potentiometer.

10. The noise generator of claim 6 wherein said offset controlling means includes a potentiometer.

11. A noise generator comprising:
    means for providing a digital signal having a pseudo-random sequence at a selected clock rate;
    a voltage controlled oscillator (VCO); and
    control means responsive to said digital signal for selectively controlling the mode of operation of the noise generator and for modulating said VCO to provide a VCO output which has a relatively constant output spectrum and high spectral containment for each mode of operation.

12. The noise generator of claim 11 wherein said control means comprises:
    filter means selectively responsive to said digital signal for providing a baseband version of said digital signal;
    modulation means for providing a modulation signal to said VCO; and
    switching means responsive to said digital signal for selectively providing to said modulation means a modulation control signal which is either said digital signal or a baseband version of said digital signal as provided by said filter means.

13. The noise generator of claim 12 wherein said filter means comprises a low pass filter having a time constant adjusted pursuant to said clock rate of said digital signal.

14. The noise generator of claim 13 wherein said time constant is selected to provide a relatively constant probability density function for said baseband version of said digital signal over its voltage range.

15. The noise generator of claim 12 wherein said control means provides for two modes of operation including (a) a first mode of operation wherein a low index of modulation is utilized and said digital signal is provided to said modulation means, and (b) a second mode of operation wherein a high index of modulation is utilized and said baseband version of said digital signal is provided to said modulation means.

16. The noise generator of claim 15 wherein said modulation means comprises:
    means for controlling the level of said modulation control signal;
    an operational amplifier responsive to said modulation control signal for providing said modulation signal which has a swing determined by the level of said modulation control signal; and
    means for controlling the offset of said operational amplifier which determines the center frequency of the output of said VCO.

17. The noise generator of claim 16 wherein said level control means controls the modulation index for said first mode of operation and controls the bandwidth of said VCO output for said second mode of operation.

18. The noise generator of clam 17 wherein said level controlling means is adjusted in said first mode of operation to control said VCO output to have a maximally flat spectrum.

19. The noise generator of claim 16 wherein said level controlling means includes a potentiometer.

20. The noise generator of claim 16 wherein said offset controlling means includes a potentiometer.

* * * * *